United States Patent [19]
Ohno

[11] Patent Number: 6,121,641
[45] Date of Patent: *Sep. 19, 2000

[54] COMPOUND SEMICONDUCTOR FIELD-EFFECT TRANSISTOR WITH IMPROVED CURRENT FLOW CHARACTERISTIC

[75] Inventor: Yasuo Ohno, Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/941,202

[22] Filed: Sep. 30, 1997

[30] Foreign Application Priority Data

Sep. 30, 1996 [JP] Japan .................. 8-259018

[51] Int. Cl.⁷ .............................................. H01L 31/0328
[52] U.S. Cl. ............................................. 257/192; 257/194
[58] Field of Search ........................... 257/24, 192, 194; 438/285, 590

[56] References Cited

U.S. PATENT DOCUMENTS 5,389,802  2/1995  Ohno ........................................ 257/192

OTHER PUBLICATIONS

Y. Ohno, "Short–Channel MOSFET $V_T$–$V_{DS}$ Characteristics Model Based on a Point Charge and Its Mirror Images", *IEEE Transactions on Electron Devices*, vol. ED–29, No. 2, Feb. 1982, pp. 211–216.

M. Nogome et al., "Shielding Effects of Drain Lag Phenomena by a p–Buffer Layer", *Electronics Information Communications Society*, 1996, pp. 101.

*Primary Examiner*—Steven H. Loke
*Attorney, Agent, or Firm*—Sughrue, Mion, Zinn, Macpeak & Seas, PLLC

[57] ABSTRACT

A p-type layer which is not depleted is inserted in a position at a depth relative to a lower surface of a gate electrode that is less than three times the distance between a lower surface of a gate electrode and a channel layer. A drain voltage at which the p-type layer is depleted is higher than a drain voltage at which a speed of electrons is saturated for thereby shielding traps while suppressing a drain parasitic capacitance and a short channel effect.

8 Claims, 9 Drawing Sheets

COMPOUND SEMICONDUCTOR FIELD-EFFECT TRANSISTOR WITH IMPROVED CURRENT FLOW CHARACTERISTIC

BACKGROUND OF THE INVENTION

1. Field of the Invention

The present invention relates to a compound semiconductor field-effect transistor.

2. Description of the Related Art

HEMTs (High Electron Mobility Transistors) which are compound semiconductor field-effect transistors with a heterojunction are widely used as a high-frequency microwave device because their electron mobility is high and operating speed is fast. The HEMTs are also expected to be applied to digital ICs for their high-speed operation.

Conventional compound semiconductor field-effect transistors suffer traps (deep levels due to impurity atoms and crystalline defects) such as substrate traps present in the semiconductor substrate and a number of interfacial traps present in the interface between the semi-insulating substrate and an epitaxial growth layer, and hence are subject to variations in the transistor current, which pose a serious problem in their applications.

Solutions to such a problem include using a p-type substrate in place of the semi-insulating substrate and inserting a p-type layer below a channel layer to electrically insulate the channel layer from the traps. However, if the p-type layer is inserted in a shallow position or a p-type substrate of high concentration is used, then a drain parasitic capacitance between a drain electrode and the p-type layer tends to increase, or the inserted p-type layer greatly lowers a drain saturated current due to its substrate effect. These schemes cannot be employed because they impair the high-speed performance of the transistors. If the p-type layer is inserted in a deep position or a p-type substrate of low concentration is used, then the shield effect of the p-type layer is reduced in a region where the electron concentration is low, and the electron concentration in the channel is varied owing to a change in the charge of the traps, resulting in a variation in the drain current. Furthermore, these solutions are unable to suppress a short channel effect that increases the drain conductance which is caused when the channel length is reduced.

According to a conventional field-effect transistor, e.g., a silicon MOSFET, in order not to lower the operating speed of the transistor, a p-type layer is inserted into a relatively deep region which has a depth that is about three times the thickness of the oxide film though the short channel effect cannot effectively be suppressed. In view of the ratio of about 3:1 between the dielectric constant of the compound semiconductor and the dielectric constant of the oxide film, the above depth corresponds to a depth that is about nine times the thickness of an electron supply layer of AlGaAs for the compound transistor HEMT. Since the AlGaAs layer is about 30 nm thick, the optimum depth of the p-type layer in the compound transistor HEMT, as estimated from the silicon MOSFET technology, is about 270 nm.

An example of compound transistor where the p-type layer is inserted in a relatively deep position is described in an article entitled "Shielding Effects of a Drain Lag Phenomena by a p-Buffer Layer", p. 101, written by Nogome, Kunihiro, Ohno, in collected lecture papers, Electronics 2, of the general conference of the Electronics Information Communications Society, 1996. According to the process described in the article, a p-type layer is placed at a depth which is about 200 nm from the channel layer, and a p-type ohmic electrode is connected to one end of the p-type layer for fixing a potential to shield traps and reduce their influences. In the compound semiconductor with the p-type layer inserted at the depth which is about 200 nm from the channel layer, however, as indicated by the article, a tradeoff occurs between the trap shield effect and an increased parasitic capacitance, failing to provide semiconductor devices of desired good characteristics.

FIG. 1 of the accompanying drawings shows in cross section a conventional compound semiconductor field-effect transistor.

As shown in FIG. 1, the conventional compound semiconductor field-effect transistor comprises a semi-insulating substrate 1, a buffer layer 10 disposed on the semi-insulating substrate 1, a p-type layer 9 disposed on the buffer layer 10, an undoped GaAs layer 8 disposed on the p-type layer 9 and having an upper portion which will act as a channel layer 8a where electrons pass when a voltage is applied, an electron supply layer 7 disposed on the undoped GaAs layer 8 for supplying electrons to the channel layer 8a, two etching stop n-type layers 6 disposed on the electron supply layer 7 for use in selective etching, two ohmic electrode cap n-type layers 5 disposed respectively on the etching stop n-type layers 6, a source electrode 2 disposed on one of the ohmic electrode cap n-type layers 5, a gate electrode 3 disposed on the electron supply layer 7, and a drain electrode 4 disposed on the other ohmic electrode cap n-type layer 5. The channel layer 8a comprises a surface layer of the undoped GaAs layer 8, and does not have an appreciable thickness as compared with the other layers. An interfacial trap 11 is developed between the semi-insulating substrate 1 and the buffer layer 10.

In the conventional compound semiconductor field-effect transistor, the p-type layer 9 is inserted in a position at a depth that is greater than three times the distance between the gate electrode 3 and the channel layer 8a in order to suppress the substrate effect and the drain parasitic capacitance.

Because the p-type layer for preventing the influences of traps including the substrate trap and the interfacial trap is inserted in a deep position to avoid the substrate effect and the drain parasitic capacitance, the conventional compound semiconductor field-effect transistor has been subject to the following difficulties:

(1) The drain conductance increases due to the short channel effect.

(2) The electric shield effect between the channel layer and the traps is reduced, varying the drain current.

SUMMARY OF THE INVENTION

It is therefore an object of the present invention to provide a compound semiconductor field-effect transistor which is capable of shielding the influences of traps including the substrate trap and the interfacial trap while suppressing the substrate effect and the drain parasitic capacitance, and also of suppressing the short channel effect.

In a compound semiconductor field-effect transistor according to the present invention, the distance from a second conductivity-type channel layer to the upper surface of a first conductivity-type layer is at most three times the distance from the channel layer to the lower surface of the gate electrode, and the drain voltage at which the first conductivity-type layer is depleted is at least that at which the channel carrier speed at the drain edge reaches its saturation speed which results in drain current saturation.

The first conductivity-type layer for electrically shielding traps is disposed in such a position that the distance from the channel layer to the upper surface of the first conductivity-type layer is at most three times the distance between the lower surface of the gate electrode and the channel layer, for thereby suppressing the short channel effect. The drain voltage at which the first conductivity-type layer is depleted is at least the drain voltage at which the channel carrier speed at the drain edge reaches its saturation speed which results in drain current saturation for thereby suppressing the drain parasitic capacitance to minimize variations in the drain current due to traps without impairing the high-speed operation capability of the compound semiconductor field-effect transistor.

The drain voltage at which the first conductivity-type layer is depleted and the drain voltage at which the channel carrier speed at the drain edge reaches its saturation are substantially the same as each other. The drain voltages thus equalized lower the operating voltage of the compound semiconductor field-effect transistor and suppress the power consumption thereof.

The compound semiconductor field-effect transistor further comprises a second conductivity-type layer disposed between the undoped GaAs layer and the first conductivity-type layer. The second conductivity-type layer disposed between the undoped GaAs layer and the first conductivity-type layer is effective to suppress the generation of an electric field that would expel the carrier and to prevent a shift of the threshold voltage.

The compound semiconductor field-effect transistor further comprises a second conductivity-type layer disposed between the undoped GaAs layer and the electron supply layer, and an undoped InGaAs layer disposed between the second conductivity-type layer and the electron supply layer. The channel layer where the carrier moves is disposed in an upper surface of the undoped InGaAs layer for increasing the mobility of the carrier thereby increasing the high-speed operation capability of the compound semiconductor field-effect transistor.

The compound semiconductor field-effect transistor according to the present invention will also function effectively without the undoped GaAs layer. The first conductivity-type layer is made as thin as possible to effectively shield traps and suppress the short channel effect.

The compound semiconductor field-effect transistor further comprises a hetero barrier layer disposed between the first conductivity-type layer and the second conductivity-type layer. The hetero barrier layer prevents holes from flowing into the first conductivity-type layer due to a confinement of channel electrons and an avalanche breakdown.

The compound semiconductor field-effect transistor according to the present invention is thus capable of shielding traps and suppressing variations in the drain current while suppressing the short channel effect without causing a reduction in the drain current and increasing the drain parasitic capacitance.

The above and other objects, features, and advantages of the present invention will become apparent from the following description with references to the accompanying drawings which illustrate examples of the present invention.

DETAILED DESCRIPTION OF THE PREFERRED EMBODIMENTS

1st Embodiment

Figure 1:
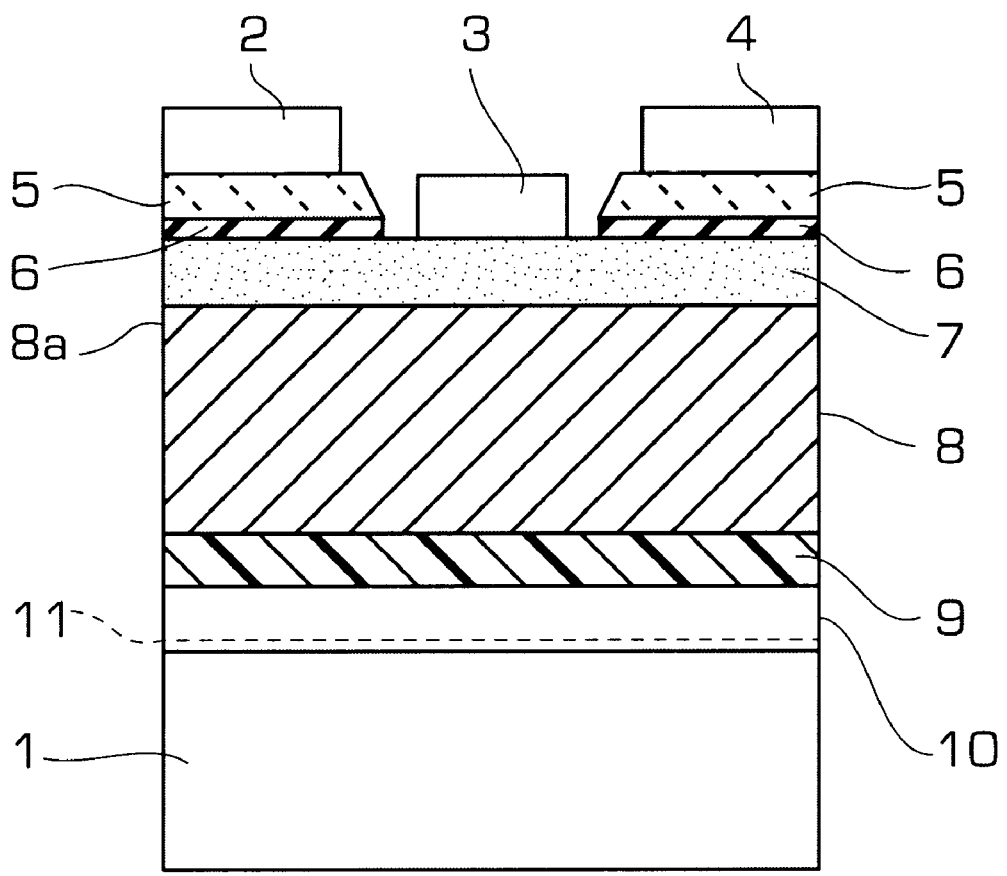
FIG. 1 is a cross-sectional view of a conventional compound semiconductor field-effect transistor.
Figure 2:
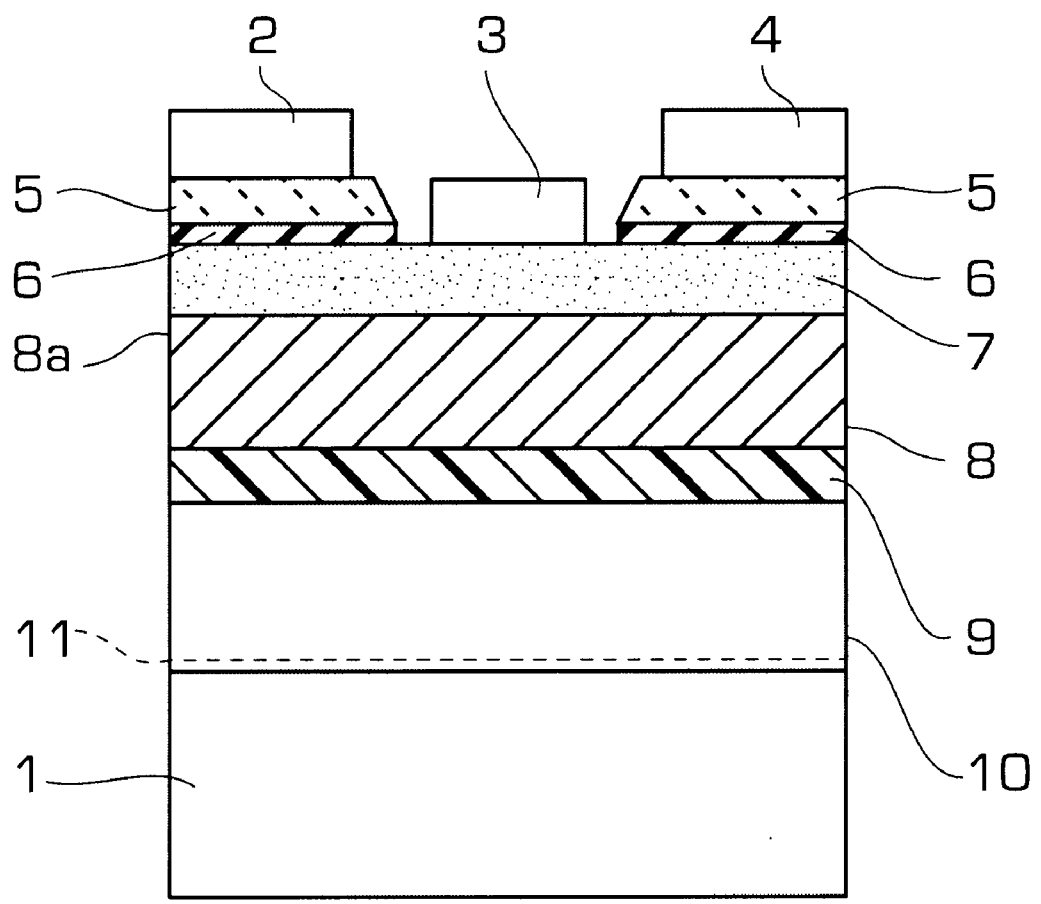
FIG. 2 is a cross-sectional view of a compound semiconductor field-effect transistor according to a first embodiment of the present invention.

FIG. 2 shows in cross section a compound semiconductor field-effect transistor according to a first embodiment of the present invention. Those parts shown in FIG. 2 which are identical to those shown in FIG. 1 are denoted by identical reference numerals, and will not be described in detail below.

In the compound semiconductor field-effect transistor according to the first embodiment, the p-type layer 9 is inserted in such a position that the distance thereof from the channel layer 8a is within three times the distance between the gate electrode 3 and the channel layer 8a.

If the p-type layer 9 is inserted in a shallow position as with the first embodiment, then it has heretofore been considered that the drain saturated current is greatly reduced due to the substrate effect, impairing the high-speed operation capability which is the greatest advantage of the compound semiconductor field-effect transistor. Such a phenomenon actually occurs with longer-channel field-effect transistors. In shorter-channel field-effect transistors, however, since electrons reach saturation speed, that is drain current saturation, at a lower drain voltage than that for carrier pinch-off, due to the relatively low saturation speed carrying the increased current, the reduced pinch-off voltage caused by the shallow p-type layer 9 will have little effect on the drain saturation current. Therefore, almost no reduction in the current occurs because of the saturated current due to the substrate effect. Therefore, the operating speed of shorter-channel field-effect transistors is not lowered by the insertion of the p-type layer 9.

The compound semiconductor in which the p-type layer 9 is inserted for shielding traps suffers the problem of a drain parasitic capacitance.

If the p-type layer 9 remains undepleted, the influences of the substrate trap and the interfacial trap 11 are shielded. Even if the p-type layer 9 is depleted by a drain voltage for reducing the parasitic capacitance, the potential of the p-type layer 9 where holes exist does not vary even when the trap charge changes, so that a change in the trap charge does not affect the channel. In the p-type layer 9 below the end of the drain electrode 4, however, electric lines of force pass from the depleted p-type layer 9 to the channel layer 8a through a region free of free charges and from the substrate trap and the interfacial trap 11 to the channel charge, varying the drain current. The magnitude of the electric lines of force becomes greater in proportion to the size of the gap, i.e., the distance between the p-type layer 9 and the channel layer 8a. Therefore, if the p-type layer 9 is placed in a shallow position, then the gap becomes small and its effect is greatly reduced, but the drain parasitic capacitance is increased.

In the conventional compound semiconductor with the p-type layer 9 inserted therein, therefore, it is difficult to achieve a state of balance between the shield effect for traps and the drain parasitic capacitance. The conventional compound semiconductor with the p-type layer 9 inserted therein has thus failed to provide good characteristics.

However, shorter-channel compound semiconductor field-effect transistors can be structurally arranged to achieve good characteristics as follows:

It is assumed that a channel potential at which the p-type layer 9 is depleted is $V_{dep}$. For determining the dopant concentration and thickness of the p-type layer 9, it is necessary to take into account the saturated drain current, the threshold voltage, the shield effect for traps, and the parasitic capacitance. The most important parameter that has to be considered is the channel potential $V_{dep}$. Generally, the drain voltage of a field-effect transistor while the circuit is in operation varies in a range that depends on the circuit arrangement.

It is assumed that the drain voltage varies in a range from $V_1$ to $V_2$ where $0<V_1<V_2$. If the p-type layer 9 is depleted, then the parasitic capacitance thereof is smaller than if the p-type layer 9 is not depleted, reducing the shield effect. Stated otherwise, in order to suppress the influence of the parasitic capacitance, the p-type layer 9 may be depleted at the drain voltage of $V_1$ or lower. In order to keep the shield effect for traps, the p-type layer 9 should preferably not be depleted up to the drain voltage of $V_2$. If p-type layer 9 is depleted at the drain voltage of $V_2$ or lower, then a region of the p-type layer 9 from an area where the channel potential is $V_{dep}$ to an area below the drain electrode 4 is depleted, and its shield effect is reduced. In this region, a change in the trap charge causes a change in the electron concentration in the channel 8a, resulting in a variation in the drain current. With shorter-channel compound semiconductor field-effect transistors, particularly n-channel field-effect transistors, since the carrier is electrons, the mobility of the carrier is high. However, because the saturation speed of the carrier thereof is about the same as that of ordinary field-effect transistors, the carrier speed is saturated with a low electric field. In the region where the carrier speed is saturated, the drain current is determined by the quantity of electrons supplied from the source electrode 2, and the electron concentration is determined by a potential distribution in the direction of the current. Therefore, the effect of traps on the drain current is very small. That is, if the drain voltage at which the channel carrier speed at the drain edge reaches its saturation speed, which results in drain current saturation is represented by Vsv, then it is not necessary to consider the shielding of traps by selecting the voltages such that $V_{sv} \leq V_{dep}$. If the voltages are selected such that $V_{sv} \leq V_{dep} < V_1$, then since the p-type layer 9 is depleted in the range of drain voltages that is used, it is also not necessary to consider the effect of the parasitic capacitance of the p-type layer 9. However, in shorter-channel compound semiconductor field-effect transistors, inasmuch as the depleted region near the drain electrode 4 where the carrier speed is saturated and the region near the source electrode 2 which is affected by traps are positioned adjacent to each other, no sufficient shield effect is accomplished unless the p-type layer 9 is inserted into a considerably shallow position.

In the drain voltage range from Vsv to $V_{dep}$, the shield effect for traps is sufficient, but the produced parasitic capacitance is large. Therefore, this drain voltage range is not usually employed. If the channel potential $V_{dep}$ is selected such that $V_{sv} = V_{dep} < V_1$, then since the voltage $V_1$ can be lowered, the operating voltage of the transistor can be reduced to reduce the power consumption.

The short channel effect can be suppressed more effectively as the dependency of the threshold voltage $V_T$ on the drain voltage $V_D (dV_T/dV_D)$ is smaller. This dependency value is greater as the depth of the p-type layer 9 is greater. Therefore, in the present embodiment where the p-type layer 9 is inserted in a shallow position, the short channel effect is greatly suppressed.

Figure 3:
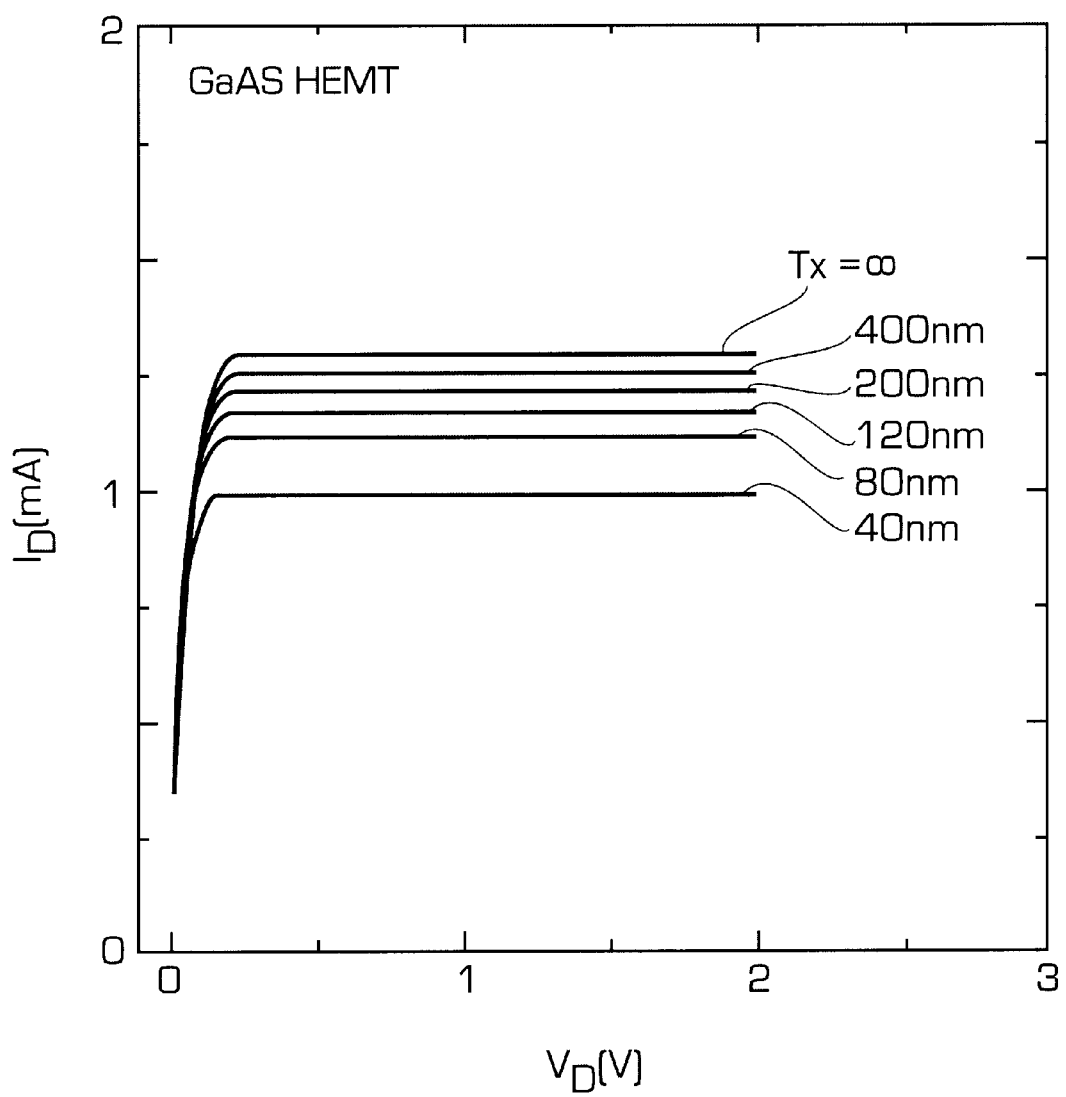
FIG. 3 is a diagram showing calculated current vs. voltage characteristics of a GaAs HEMT.
Figure 4:
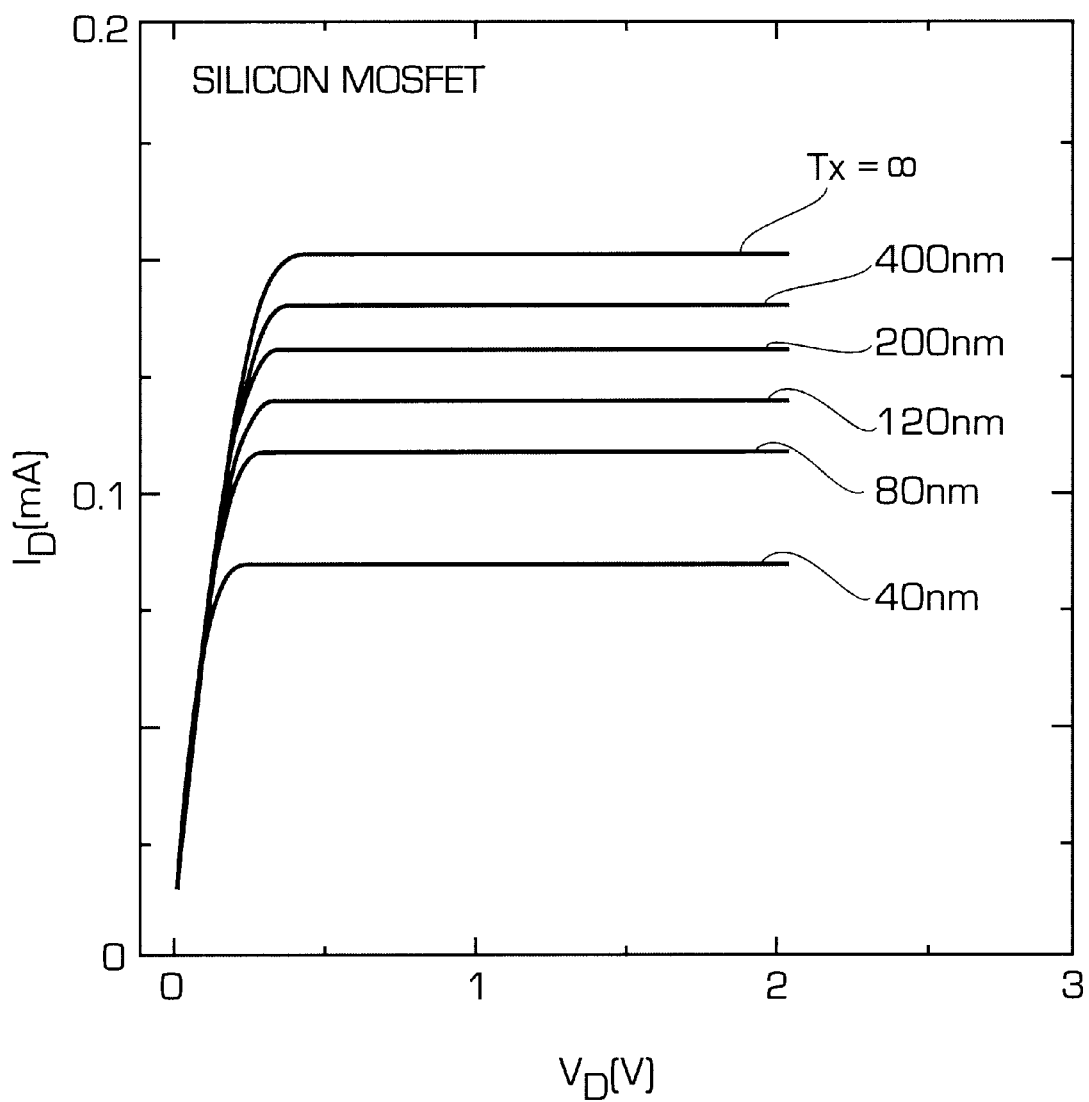
FIG. 4 is a diagram showing calculated current vs. voltage characteristics of a silicon MOSFET.
Figure 5:
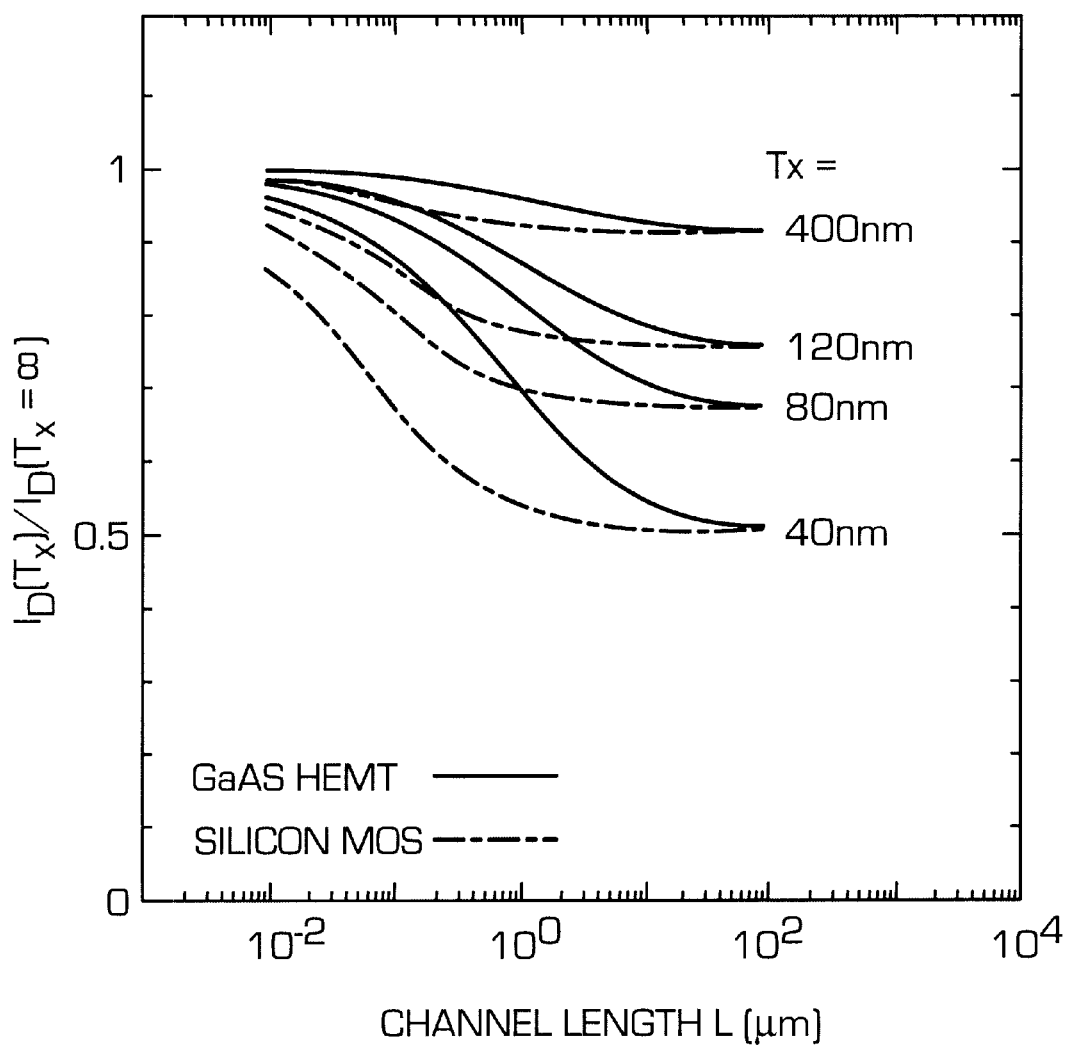
FIG. 5 is a diagram showing how a drain current $I_D$ is reduced when a channel length is changed.

Current vs. voltage characteristics of transistors calculated with respect to an analytic model which has taken into account the substrate effect and the saturation speed are shown in FIGS. 3, 4 and 5.

FIG. 3 shows calculated current vs. voltage characteristics of a GaAs HEMT which is a compound semiconductor, and FIG. 4 shows calculated current vs. voltage characteristics of a silicon MOSFET. In FIGS. 3 and 4, $V_D$ represents the drain voltage, $I_D$ represents the drain current, and $T_X$ represents the depth of the p-type layer 9, i.e., the distance between the upper surface of the p-type layer 9 and the channel layer 8a. FIG. 5 shows how a drain current $I_D$ is reduced when a channel length L is changed. Assuming that the transistor has no substrate effect at a certain fixed channel length, a current is determined ($I_D(T_X=\infty)$), and the measured ratio of a drain current ($I_D(T_X)$) to the determined current is illustrated.

In FIGS. 3, 4, and 5, calculations are carried out on the assumption that a low field mobility, which is an electron mobility at a low electric field, is 300 $cm^2/V \cdot sec$ for the silicon MOSFET and 8000 $cm^2/V \cdot sec$ for the GaAsHEMT, and a carrier saturation speed is $1 \times 10^7 cm/sec.$ and $2 \times 10^7 cm/sec.$ respectively for the silicon MOSFET and the GaAsHEMT. Both the silicon MOSFET and the GaAsHEMT are assumed to have a channel length of 0.5 $\mu m$. It is also assumed that the electron supply layer 7 of the GaAsHEMT has a thickness of 40 nm and the gate oxide film of the silicon MOSFET has a thickness of 120 nm, and that the GaAsHEMT has a threshold value of −0.5 V and a gate voltage of 0 V and the silicon MOSFET has a threshold value of 0.5 V and a gate voltage of 1.0 V to provide the same conditions.

A comparison of FIGS. 3 and 4 indicates that even though the p-type layer 9 is inserted in a shallow position similarly in both the silicon MOSFET and the GaAsHEMT, the rate at which the drain current $I_D$ drops is smaller in the GaAsHEMT than in the silicon MOSFET. With the GaAsHEMT, the current that flows when the depth $T_X$ is 120 nm which is three times the thickness (40 nm) of the electron supply layer 7 is about 10% smaller than the current that flows when the depth $T_X=\infty$. With the silicon MOSFET, the current that flows when the depth $T_X=120$ nm is about 21% smaller than the current that flows when the depth $T_X=\infty$.

It can be seen from FIG. 5 that with the GaAsHEMT which is a compound semiconductor, when the channel length is less than or equal to 1 $\mu m$, reduction in drain current due to the small $T_X$ becomes less dominant, compared with those for long-channel FETs. With the silicon MOSFET, such a phenomenon does not occur unless the channel length is about 0.1 $\mu m$ or smaller, which is about one-tenth of the channel length of the GaAsHEMT.

Specific structures of epitaxial growth layers according to this embodiment are shown in Tables 1, 2, and 3.

Table 1 show values of a structure on the assumption that the threshold voltage is −0.5 V and the channel length is 0.5 μm. A drain voltage $V_{sv}$ at which channel carrier speed at the drain edge reaches its saturation speed, which results in drain current saturation, is calculated as $V_{sv}=L \cdot v_{(sat)}/\mu_0 32$ 0.125 V where L represents the channel length, $V_{(sat)}$ represents the speed at which the carrier is saturated represents, and $\mu_0$ represents the low field mobility. Since the charge does not travel at the saturation speed in the full region of the channel layer 8a, however, the drain current which is about twice the calculated drain current is actually necessary. For this reason, the channel potential $V_{dep}$ is set to 0.3 V.

Table 2 show values of a structure on the assumption that the channel length is 0.3 μm. Since drain voltage Vsv at which the channel carrier speed at the drain edge reaches its saturation speed, which results in drain current saturation, is about 0.15 V, the channel potential $V_{dep}$ is set to 0.2 V.

Table 3 shows values of a structure for a relatively large range of drain voltage variations as for a differential amplifier. A pinch-off voltage is assumed to be 1 V for increasing the shielding ability of the p-type layer 9 in a region where the carrier speed is saturated, for further suppressing current variations.

TABLE 1

| Ref. No. | Layers | Composition | Thickness (nm) | Dopant | Dopant concentration (cm$^{-3}$) |
|---|---|---|---|---|---|
| 5 | n-GaAs | — | 200 | Si | 2 × 10$^{18}$ |
| 6 | n-AlAs | | 2 | Si | 2 × 10$^{18}$ |
| 7 | n-Al$_x$Ga$_{1-x}$As | x = 0.2 | 37 | Si | 2 × 10$^{18}$ |
| 8 | i-GaAs | | 80 | — | |
| 9 | p-GaAs | | 15 | C or Be | 1 × 10$^{18}$ |
| 10 | i-GaAs | | 200 | — | |
| 1 | substrate | | | | |

TABLE 2

| Ref. No. | Layers | Composition | Thickness (nm) | Dopant | Dopant concentration (cm$^{-3}$) |
|---|---|---|---|---|---|
| 5 | n-GaAs | — | 200 | Si | 2 × 10$^{18}$ |
| 6 | n-AlAs | | 2 | Si | 2 × 10$^{18}$ |
| 7 | n-Al$_x$Ga$_{1-x}$As | x = 0.2 | 37 | Si | 2 × 10$^{18}$ |
| 8 | i-GaAs | | 80 | — | |
| 9 | p-GaAs | | 14 | C or Be | 1 × 10$^{18}$ |
| 10 | i-GaAs | | 200 | — | |
| 1 | substrate | | | | |

TABLE 3

| Ref. No. | Layers | Composition | Thickness (nm) | Dopant | Dopant concentration (cm$^{-3}$) |
|---|---|---|---|---|---|
| 5 | n-GaAs | — | 200 | Si | 2 × 10$^{18}$ |
| 6 | n-AlAs | | 2 | Si | 2 × 10$^{18}$ |
| 7 | n-Al$_x$Ga$_{1-x}$As | x = 0.2 | 37 | Si | 2 × 10$^{18}$ |
| 8 | i-GaAs | | 80 | — | |
| 9 | p-GaAs | | 20 | C or Be | 1 × 10$^{18}$ |
| 10 | i-GaAs | | 200 | — | |
| 1 | substrate | | | | |

2nd Embodiment

Figure 6:
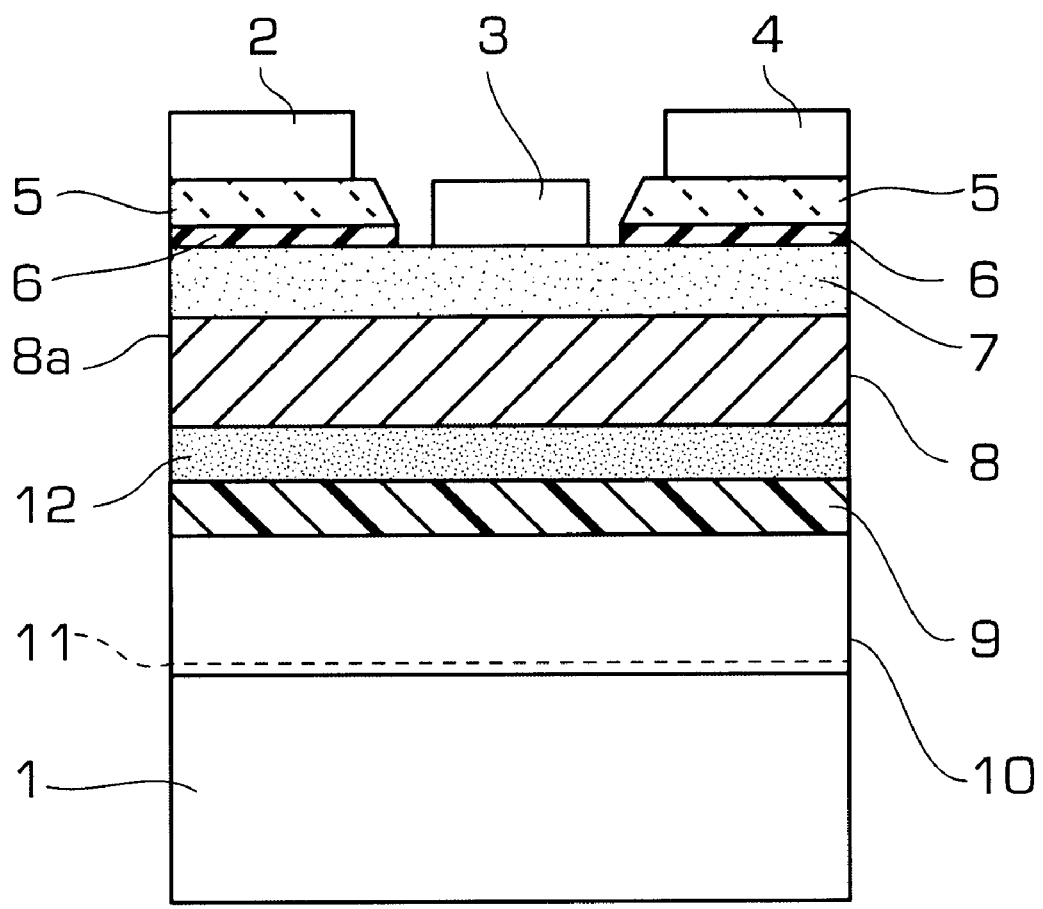
FIG. 6 is a cross-sectional view of a compound semiconductor field-effect transistor according to a second embodiment of the present invention.

A compound semiconductor field-effect transistor according to a second embodiment of the present invention will be described below with reference to FIG. 6.

The compound semiconductor field-effect transistor according to the second embodiment differs from the compound semiconductor field-effect transistor according to the first embodiment in that an n-type layer 12 is disposed between the undoped GaAs layer 8 and the p-type layer 9.

Generally, if the p-type layer 9 is shifted toward the channel layer 8a, then since the electric field between the channel layer 8a and the p-type layer 9 becomes larger, the threshold voltage of the transistor is shifted in a positive direction. Usually, a low threshold voltage which is negative or up to about +0.2 V is employed. The problem of the threshold voltage being shifted by the p-type layer 9 that is inserted in a shallow position can be coped with by increasing the donor concentration. In order to prevent electrons from flowing into the electron supply layer 7 to lower the mobility greatly, the n-type layer 12 may be inserted between the channel layer 8a and the p-type layer 9. Inasmuch as electrons flowing through the n-type layer 12 serve as part of the drain current, the process of designing the threshold value includes how to establish the concentration, phase, and thickness of the n-type layer 12. To achieve the same characteristics as the conventional transistors, the n-type layer 12 is always depleted to cause electrons to flow in the surface. The parameters of the n-type layer 12 can be selected by controlling an appropriate doping impurity, its concentration, and the layer thickness in the epitaxial crystal growth process. A specific structure of epitaxial growth layers according to the second embodiment is shown in Table 4.

Table 4 shows values of a structure on the assumption that the threshold voltage is −1 V with respect to the channel length of 0.3 μm.

TABLE 4

| Ref. No. | Layers | Composition | Thickness (nm) | Dopant | Dopant concentration (cm$^{-3}$) |
|---|---|---|---|---|---|
| 5 | n-GaAs | — | 200 | Si | 2 × 10$^{18}$ |
| 6 | n-AlAs | | 2 | Si | 2 × 10$^{18}$ |
| 7 | n-Al$_x$Ga$_{1-x}$As | x = 0.2 | 37 | Si | 2 × 10$^{18}$ |
| 8 | i-GaAs | | 40 | — | |
| 12 | n-GaAs | | 14 | Si | 1 × 10$^{18}$ |
| 9 | p-GaAs | | 15 | C or Be | 1 × 10$^{18}$ |
| 10 | i-GaAs | | 200 | — | |
| 1 | substrate | | | | |

3rd Embodiment

Figure 7:
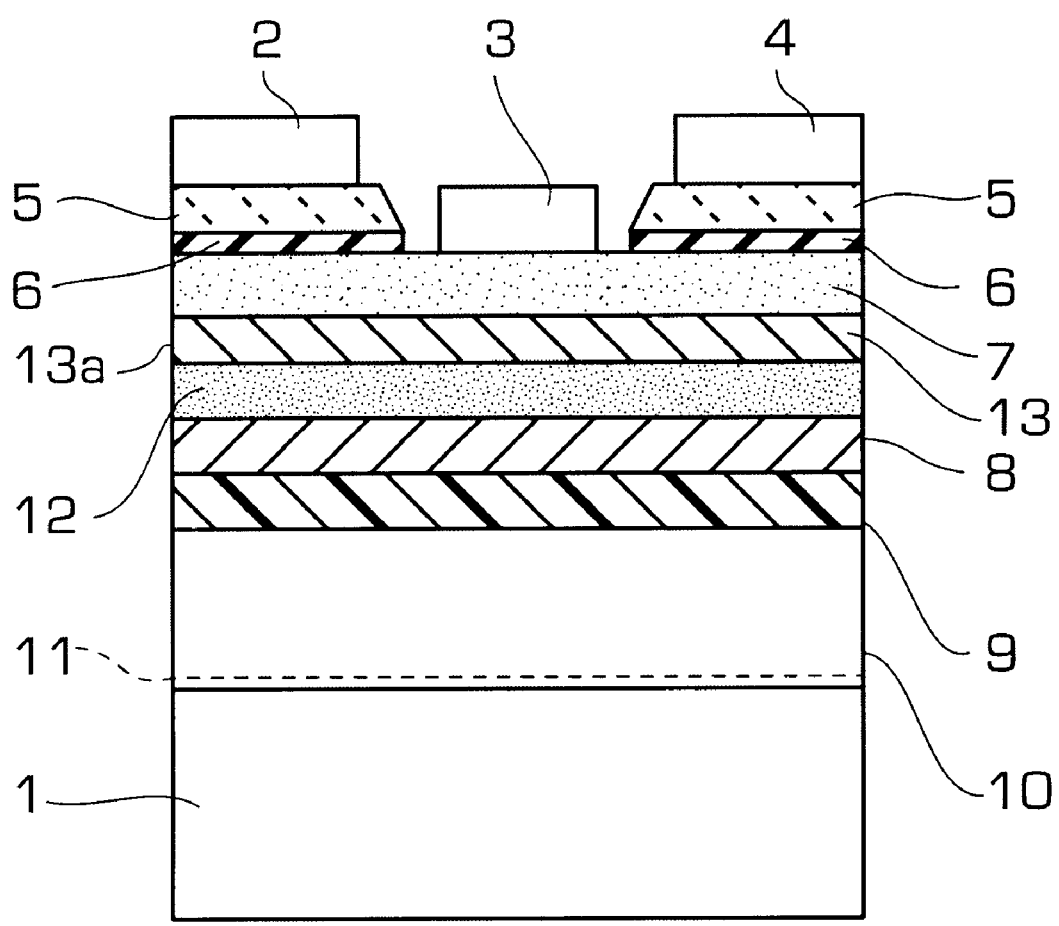
FIG. 7 is a cross-sectional view of a compound semiconductor field-effect transistor according to a third embodiment of the present invention.

A compound semiconductor field-effect transistor according to a third embodiment of the present invention will be described below with reference to FIG. 7.

The compound semiconductor field-effect transistor according to the third embodiment differs from the compound semiconductor field-effect transistor according to the first embodiment in that an n-type layer 12 is disposed between the undoped GaAs layer 8 and the electron supply layer 7, and an undoped InGaAs layer 13 is disposed between the n-type layer 12 and the electron supply layer 7. In this embodiment, a channel layer 13a is formed in an upper surface of the undoped InGaAs layer 13. Since the channel layer 13a where electrons move is formed in the undoped InGaAs layer 13, the electron mobility is increased to enable the transistor to operate at a higher speed.

A specific structure of epitaxial growth layers according to the third embodiment is shown in Table 5.

TABLE 5

| Ref. No. | Layers | Composition | Thickness (nm) | Dopant | Dopant concentration ($cm^{-3}$) |
|---|---|---|---|---|---|
| 5 | n-GaAs | — | 200 | Si | $2 \times 10^{18}$ |
| 6 | n-AlAs | | 2 | Si | $2 \times 10^{18}$ |
| 7 | n-$Al_xGa_{1-x}As$ | x = 0.2 | 30 | Si | $2 \times 10^{18}$ |
| 13 | i-$In_yGa_{1-y}As$ | y = 0.1 | 15 | — | |
| 12 | n-GaAs | | 15 | Si | $1 \times 10^{18}$ |
| 8 | i-GaAs | | 20 | — | |
| 9 | p-GaAs | | 24 | C or Be | $1 \times 10^{18}$ |
| 10 | i-GaAs | | 200 | — | |
| 1 | substrate | | | | |

4th Embodiment

Figure 8:
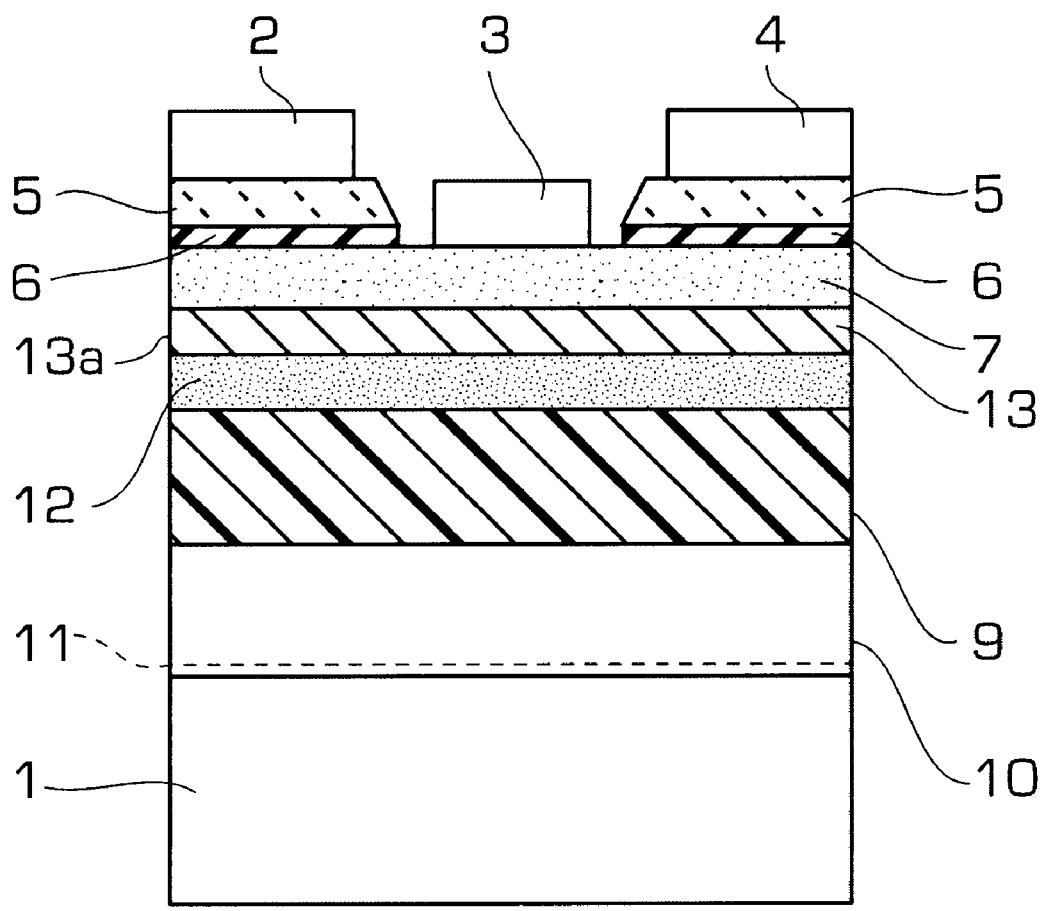
FIG. 8 is a cross-sectional view of a compound semiconductor field-effect transistor according to a fourth embodiment of the present invention.

A compound semiconductor field-effect transistor according to a fourth embodiment of the present invention will be described below with reference to FIG. 8.

According to the fourth embodiment, the p-type layer 9 is inserted in the shallowest position possible with the current epitaxial technology in order to suppress the short channel effect. The compound semiconductor field-effect transistor according to the fourth embodiment differs from the compound semiconductor field-effect transistor according to the third embodiment shown in FIG. 7 in that the undoped GaAs layer 8 is dispensed with, and the dopant concentration of the n-type layer 12 is higher for keeping the threshold voltage.

A specific structure of epitaxial growth layers according to the fourth embodiment is shown in Table 6.

TABLE 6

| Ref. No. | Layers | Composition | Thickness (nm) | Dopant | Dopant concentration ($cm^{-3}$) |
|---|---|---|---|---|---|
| 5 | n-GaAs | — | 200 | Si | $2 \times 10^{18}$ |
| 6 | n-AlAs | | 2 | Si | $2 \times 10^{18}$ |
| 7 | n-$Al_xGa_{1-x}As$ | x = 0.2 | 30 | Si | $2 \times 10^{18}$ |
| 13 | i-$In_yGa_{1-y}As$ | y = 0.1 | 15 | — | |
| 12 | n-GaAs | | 17 | Si | $2 \times 10^{18}$ |
| 9 | p-GaAs | | 38 | C or Be | $1 \times 10^{18}$ |
| 10 | i-GaAs | | 200 | — | |
| 1 | substrate | | | | |

5th Embodiment

Figure 9:
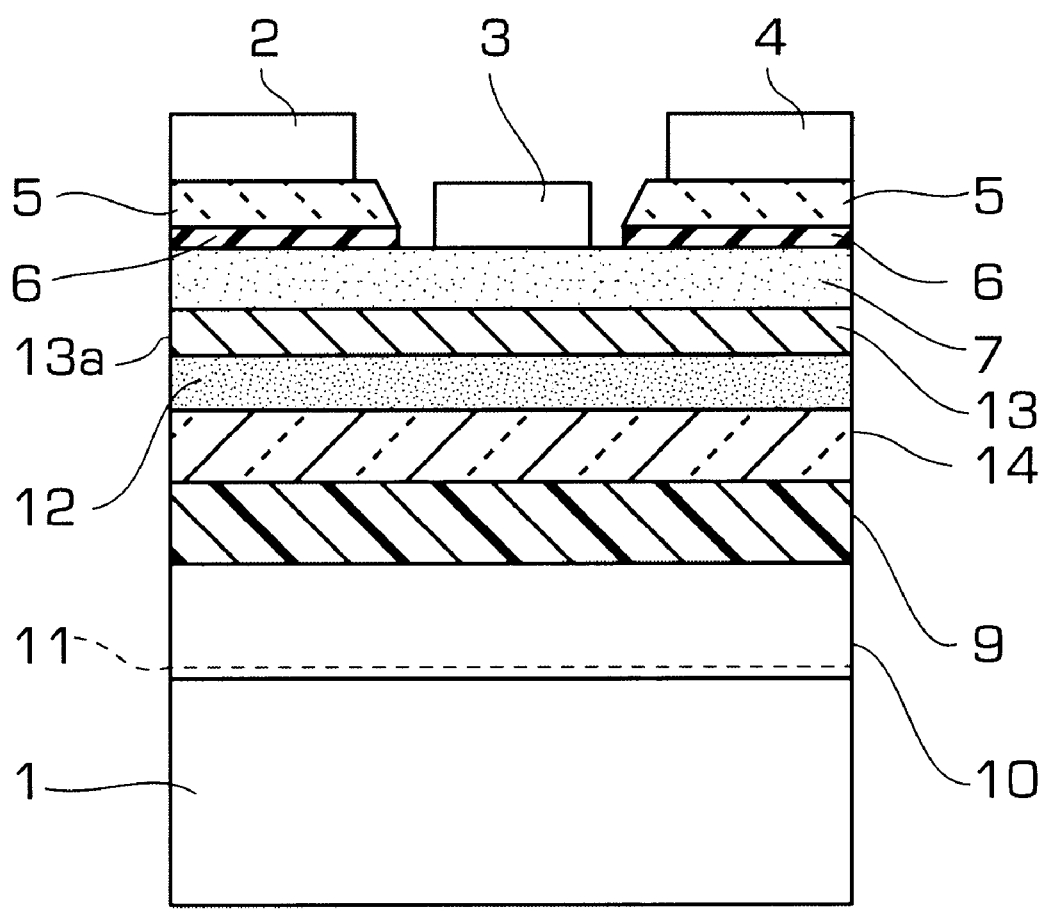
FIG. 9 is a cross-sectional view of a compound semiconductor field-effect transistor according to a fifth embodiment of the present invention.

A compound semiconductor field-effect transistor according to a fifth embodiment of the present invention will be described below with reference to FIG. 9.

The compound semiconductor field-effect transistor according to the fifth embodiment differs from the compound semiconductor field-effect transistor according to the fourth embodiment in that an AlGaAs hetero barrier layer 14 is disposed between the n-type layer 12 and the p-type layer 9. The AlGaAs hetero barrier layer 14 is effective to prevent holes from flowing into the p-type layer 9 due to a confinement of channel electrons and an avalanche breakdown, without affecting the operation of the compound semiconductor field-effect transistor. With the first embodiment shown in FIG. 2, since the potential of the p-type layer 9 is fixed by electrically connecting the p-type layer 9 to the source electrode 2 with a leakage current that flows from the source electrode 2 into the p-type layer 9, it is not desirable for the purpose of fixing the potential of the p-type layer 9 to insert a hetero structure between the p-type layer 9 and the channel layer 8a. If an electrode is produced directly by the p-type layer 9 which is fabricated by ion implantation, then no such a problem arises, and the insertion of the AlGaAs hetero barrier layer 14 is effective.

A specific structure of epitaxial growth layers according to the fifth embodiment is shown in Table 7.

TABLE 7

| Ref. No. | Layers | Composition | Thickness (nm) | Dopant | Dopant concentration ($cm^{-3}$) |
|---|---|---|---|---|---|
| 5 | n-GaAs | — | 200 | Si | $2 \times 10^{18}$ |
| 6 | n-AlAs | | 2 | Si | $2 \times 10^{18}$ |
| 7 | n-$Al_xGa_{1-x}As$ | x = 0.2 | 30 | Si | $2 \times 10^{18}$ |
| 13 | i-$In_yGa_{1-y}As$ | y = 0.1 | 15 | — | |
| 12 | n-GaAs | | 15 | Si | $1 \times 10^{18}$ |
| 14 | i-$Al_xGa_{1-x}As$ | x = 0.2 | 20 | — | |
| 9 | p-GaAs | | 24 | C or Be | $1 \times 10^{18}$ |
| 10 | i-GaAs | | 200 | — | |
| 1 | substrate | | | | |

With the structures according to the first through fifth embodiments, it is only necessary to improve epitaxial growth layers, but not to modify the designing of masks and the fabrication process. For introducing a new p-type layer 9 and preventing the parasitic capacitance thereof while maintaining the capability for shielding traps in the epitaxial growth process, the p-type layer 9 needs to be formed with relatively high accuracy. The required level of accuracy can sufficiently be achieved by the MBE (molecular beam epitaxy) process.

In each of the first through fifth embodiments, the present invention has been described with respect to the n-channel FET. However, the present invention can offer the same advantages with a p-channel FET if the charge and impurity are reversed.

It is to be understood that variations and modifications of the cross-connection devices disclosed herein will be evident to those skilled in the art. It is intended that all such modifications and variations be included within the scope of the appended claims.

What is claimed is:

1. A compound semiconductor field-effect transistor comprising:

a semi-insulating substrate;

a buffer layer disposed on said semi-insulating substrate;

a first conductivity-type layer, disposed on said buffer layer, having structural characteristics such that a drain deplete voltage at which said first conductivity-type layer is depleted is not less than a drain saturation voltage at which a channel carrier speed at a drain edge reaches its saturation speed resulting in drain current saturation, wherein said structural characteristics comprise:
a first conductivity-type layer concentration; and
a first conductivity-type layer thickness;
an undoped GaAs layer, disposed on said first conductivity-type layer, having an upper surface serving as a channel layer for passage of a carrier therein when a drain voltage is applied;
an electron supply layer disposed on said undoped GaAs layer for supplying said carrier which passes through said channel layer; and
a gate electrode disposed on said electron supply layer;
wherein the distance from said channel layer to the upper surface of said first conductivity-type layer is no more than three times the distance from said channel layer to the lower surface of said gate electrode.

2. A compound semiconductor field-effect transistor according to claim 1, wherein said drain deplete voltage and said drain saturation voltage are substantially the same.

3. A compound semiconductor field-effect transistor according to claim 1, further comprising a second conductivity-type layer disposed between said undoped GaAs layer and said first conductivity-type layer.

4. A compound semiconductor field-effect transistor comprising:
a semi-insulating substrate;
a buffer layer disposed on said semi-insulating substrate;
a first conductivity-type layer, disposed on said buffer layer, having structural characteristics such that a drain deplete voltage at which said first conductivity-type layer is depleted is not less than a drain saturation voltage at which a channel carrier speed at a drain edge reaches its saturation speed resulting in drain current saturation, wherein said structural characteristics comprise:
a first conductivity-type layer concentration; and
a first conductivity-type layer thickness;
an undoped GaAs layer, disposed on said first conductivity-type layer;
a second conductivity-type layer disposed on said undoped GaAs layer;
an undoped InGaAs layer, disposed on said second conductivity-type layer, having an upper surface serving as a channel layer for passage of a carrier therein when a drain voltage is applied;
an electron supply layer disposed on said undoped InGaAs layer for supplying said carrier which passes through said channel layer; and
a gate electrode disposed on said electron supply layer;
wherein the distance from said channel layer to the upper surface of said first conductivity-type layer is no more than three times the distance from said channel layer to the lower surface of said gate electrode.

5. A compound semiconductor field-effect transistor according to claim 4, wherein said drain deplete voltage and said drain saturation voltage are substantially the same.

6. A compound semiconductor field-effect transistor comprising:
a semi-insulating substrate;
a buffer layer disposed on said semi-insulating substrate;
a first conductivity-type layer, disposed on said buffer layer, having structural characteristics such that a drain deplete voltage at which said first conductivity-type layer is depleted is not less than a drain saturation voltage at which a channel carrier speed at a drain edge reaches its saturation speed resulting in drain current saturation, wherein said structural characteristics comprise:
a first conductivity-type layer concentration; and
a first conductivity-type layer thickness;
a second conductivity-type layer disposed on said first conductivity-type layer;
an undoped InGaAs layer, disposed on said second conductivity-type layer, having an upper surface serving as a channel layer for passage of a carrier therein when a drain voltage is applied;
an electron supply layer disposed on said undoped InGaAs layer for supplying said carrier which passes through said channel layer; and
a gate electrode disposed on said electron supply layer;
wherein the distance from said channel layer to the upper surface of said first conductivity-type layer is no more than three times the distance from said channel layer to the lower surface of said gate electrode.

7. A compound semiconductor field-effect transistor according to claim 6, further comprising a hetero barrier layer disposed between said first conductivity-type layer and said second conductivity-type layer.

8. A compound semiconductor field-effect transistor according to claim 6, wherein said drain deplete voltage and said drain saturation voltage are substantially the same.

* * * * *

UNITED STATES PATENT AND TRADEMARK OFFICE
CERTIFICATE OF CORRECTION

PATENT NO.: 6,121,641
DATED: September 19, 2000
INVENTOR(S): Yasuo OHNO

It is certified that error(s) appears in the above-identified patent and that said Letters Patent is hereby corrected as shown below:

Column 7, line 5, delete "32" insert --=--.

Signed and Sealed this

First Day of May, 2001

*Attest:*

NICHOLAS P. GODICI

*Attesting Officer*   *Acting Director of the United States Patent and Trademark Office*